United States Patent
Lodden et al.

(10) Patent No.: US 10,024,656 B2
(45) Date of Patent: Jul. 17, 2018

(54) SYSTEM AND METHODS FOR HIGHLY INTEGRATED OPTICAL READOUT MEMS SENSORS

(71) Applicant: Honeywell International Inc., Morristown, NJ (US)

(72) Inventors: Grant H. Lodden, Minnetrista, MN (US); Robert D. Horning, Savage, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/721,914

(22) Filed: May 26, 2015

(65) Prior Publication Data
US 2016/0320180 A1 Nov. 3, 2016

Related U.S. Application Data

(60) Provisional application No. 62/154,197, filed on Apr. 29, 2015.

(51) Int. Cl.
*G02B 6/12* (2006.01)
*G02B 6/42* (2006.01)
(Continued)

(52) U.S. Cl.
CPC ........ *G01B 11/272* (2013.01); *G01C 19/5621* (2013.01); *G01C 19/5656* (2013.01);
(Continued)

(58) Field of Classification Search
CPC .............. G01B 11/272; G01C 19/5621; G01C 19/5656; G01C 25/00; G01P 15/093;
(Continued)

(56) References Cited

U.S. PATENT DOCUMENTS 4,420,259 A 12/1983 Taylor
4,567,771 A 2/1986 Nelson et al.
(Continued)

FOREIGN PATENT DOCUMENTS

CN 103743390 4/2014
EP 0527604 2/1993
(Continued)

OTHER PUBLICATIONS

European Patent Office, "Extended European Search Report for EP Patent Application No. 161660973.2 dated Sep. 16, 2016", "from Foreign Counterpart of U.S. Application No.", Sep. 16, 2016, pp. 1-12, Published in: EP.
(Continued)

*Primary Examiner* — John M Bedtelyon
(74) *Attorney, Agent, or Firm* — Fogg & Powers LLC

(57) ABSTRACT

System and methods for highly integrated optical readout MEMS sensors are provided. In one embodiment, a method for an integrated waveguide optical-pickoff sensor comprises: launching a laser beam generated by a laser light source into an integrated waveguide optical-pickoff monolithically fabricated within a first substrate, the integrated waveguide optical-pickoff including an optical input port, a coupling port, and an optical output port; and detecting an amount of coupling of the laser beam from the coupling port to a sensor component separated from the coupling port by a gap by measuring an attenuation of the laser beam at the optical output port.

16 Claims, 10 Drawing Sheets

(51) Int. Cl.
| | |
|---|---|
| G02B 6/43 | (2006.01) |
| G01B 11/27 | (2006.01) |
| G01C 19/5621 | (2012.01) |
| G01C 19/5656 | (2012.01) |
| G01C 25/00 | (2006.01) |
| G01P 15/093 | (2006.01) |
| G01P 15/13 | (2006.01) |
| G01P 21/00 | (2006.01) |
| G01P 15/08 | (2006.01) |

(52) U.S. Cl.
CPC ............ *G01C 25/00* (2013.01); *G01P 15/093* (2013.01); *G01P 15/13* (2013.01); *G01P 21/00* (2013.01); *G02B 6/12* (2013.01); *G02B 6/4295* (2013.01); *G02B 6/43* (2013.01); *B81B 2201/0228* (2013.01); *B81B 2201/04* (2013.01); *B81B 2203/053* (2013.01); *G01P 2015/0822* (2013.01); *G02B 2006/12138* (2013.01)

(58) Field of Classification Search
CPC .. G01P 21/00; G01P 15/13; G01P 2015/0822; G02B 6/12; G02B 6/4295; G02B 6/43; G02B 2006/12138; B81B 2201/0228; B81B 2201/04; B81B 2203/053
See application file for complete search history.

(56) References Cited

U.S. PATENT DOCUMENTS

| | | | |
|---|---|---|---|
| 4,662,751 | A | 5/1987 | Goss |
| 4,914,291 | A | 4/1990 | Kan et al. |
| 4,983,007 | A | 1/1991 | James et al. |
| 6,377,718 | B1 | 4/2002 | Que et al. |
| 6,490,391 | B1 | 12/2002 | Zhao et al. |
| 6,571,035 | B1 | 5/2003 | Pi et al. |
| 6,621,952 | B1 | 9/2003 | Pi et al. |
| 6,625,349 | B2 | 9/2003 | Zhao et al. |
| 6,668,111 | B2 | 12/2003 | Tapalian et al. |
| 6,718,097 | B2 | 4/2004 | Dyott |
| 6,879,751 | B2 | 4/2005 | Deliwala |
| 7,085,452 | B1 | 8/2006 | Lin et al. |
| 7,406,220 | B1 | 7/2008 | Christensen et al. |
| 7,486,855 | B2 | 2/2009 | Smith et al. |
| 7,512,298 | B2 | 3/2009 | Yi et al. |
| 7,702,202 | B2 | 4/2010 | Koch et al. |
| 7,840,102 | B2 | 11/2010 | Boyd |
| 7,903,240 | B2 | 3/2011 | Smith et al. |
| 7,903,906 | B2 | 3/2011 | Smith et al. |
| 7,933,022 | B2 | 4/2011 | Smith et al. |
| 8,124,927 | B2 | 2/2012 | Savchenkov et al. |
| 8,542,365 | B2 | 9/2013 | Pruessner et al. |
| 8,755,106 | B2 | 6/2014 | Zhang et al. |
| 9,012,830 | B2 | 4/2015 | Zhu et al. |
| 9,069,004 | B2 | 6/2015 | Bhave et al. |
| 9,395,177 | B2 * | 7/2016 | Pruessner .............. G01B 11/14 |
| 2002/0044721 | A1 | 4/2002 | Bjorklund |
| 2002/0094168 | A1 | 7/2002 | Cai et al. |
| 2004/0223697 | A1 | 11/2004 | Andersen et al. |
| 2006/0103851 | A1 | 5/2006 | Nathan et al. |
| 2006/0133728 | A1 | 6/2006 | Biyikli et al. |
| 2008/0271533 | A1 | 11/2008 | Csutak |
| 2010/0097682 | A1 | 4/2010 | Angeley et al. |
| 2014/0283601 | A1 | 9/2014 | Bhave et al. |
| 2014/0363119 | A1 | 12/2014 | Stephens et al. |
| 2015/0020590 | A1 | 1/2015 | Painter et al. |
| 2016/0320180 | A1 | 11/2016 | Lodden et al. |
| 2016/0334440 | A1 | 11/2016 | Fertig et al. |
| 2016/0349283 | A1 | 12/2016 | Bramhavar et al. |
| 2016/0377434 | A1 | 12/2016 | Horning et al. |

FOREIGN PATENT DOCUMENTS

| | | |
|---|---|---|
| EP | 1083429 | 3/2001 |
| JP | 2006064977 A | 3/2006 |
| WO | 2013052953 A1 | 4/2013 |
| WO | 2015088738 | 6/2015 |

OTHER PUBLICATIONS

Burcham et al, "Micromachined Silicon Cantilever Beam Accelerometer Incorporating an Integrated Optical Waveguide", "Integrated Optics and Microstructures (1992)", Sep. 8, 1992, pp. 1-7, vol. 1793, Published in: US.

Culshaw, "Fibre optic sensor: integration with micromachined devices", Mar. 1, 1995, pp. 463-469, vol. 47, No. 1-3, Publisher: Sensors and Actuators A : Elsevier Science S.A.

Dong et al., "An On-Chip Opto-Mechanical Accelerometer", "Micro Electro Mechanical Systems (MEMS), 2013", Jan. 20, 2013, pp. 641-644, Publisher: IEEE 26th International Conference, Published in: Taipei, Taiwan.

Kalenik et al., "A cantilever optical-fiber accelerometer", Jun. 15, 1998, pp. 350-355, vol. 68, No. 1-3, Publisher: Sensors and Actuators A : Elsevier Science S.A.

Jiang et al., "Optical actuation of silicon cantilevers: Modelling and Experimental investigation", "Proceedings of SPIE downloaded from http://proceedings.spiedigitallibrary.org/", May 17, 2013, pp. 1-14, vol. 8763.

Horning et al., "Systems and Methods for a Time-Based Optical Pickoff for MEMS Sensors", "U.S. Appl. No. 14/860,443, filed Sep. 21, 2015, Sep. 21, 2015", pp. 1-25, Publisher: Published in: US.

"Femtosecond Laser Processing of Miniaturized Optical Systems and Sensors in Glass Substrates", "Retrieved Apr. 28, 2015 from http://www.hhi.fraunhofer.de/departments/fiber-optical-sensor-systems/research-topics/smart-materials/femtosecond-laser-processing-of-miniaturized-optical-systems-and-sensors-in-glass-substrates.html", 2015, pp. 1-3, Publisher: Fraunhofer Heinrich Hertz Institute.

Osellame et al., "Femtosecond laser fabrication for the integration of optical sensors in microfluidic lab-on-chip devices", Jul. 23, 2009, pp. 1-3.

Rogers, "Evanescent Wave Coupling Using Different Subwavelength Gratings for a MEMS Accelerometer", Mar. 28, 2011, pp. 1-160, Publisher: University of South Florida Scholar Commons.

Sauter et al., "Making Optical MEMS Sensors more compact using Organic Light Sources and Detectors", "2014 IEEE Emerging Technology and Factory Automation (ETFA)", Sep. 16-19, 2014, pp. 1-4.

European Patent Office, "Extended European Search Report— Application No. 16174671.4 dated Oct. 28, 2016", "from foreign counterpart of U.S. Appl. No. 14/860,443", Oct. 28, 2016, pp. 1-14, Published in: EP.

United States Patent and Trademark Office, "Office Action", "from U.S. Appl. No. 14/860,443", Jan. 17, 2017, pp. 1-25, Published in: US.

Guldimann et al., "Fiber-Optic Accelerometer With Micro-Optical Shutter Modulation and Integrated Damping", "IEEE/LEOS International Conference on Optical Mems, XP001034987, DOI: 10.1109/OMEMS.2000.879665", Aug. 21, 2000, pp. 141-142.

United States Patent and Trademark Office, "Notice of Allowance", "From U.S. Appl. No. 14/860,443", dated Jun. 16, 2017, pp. 1-13, Published in: US.

United States Patent and Trademark Office, "Corrected Notice of Allowability", "From U.S. Appl. No. 14/860,443", dated Jul. 12, 2017, pp. 1-7, Published in: US.

Basarir, Onur et al, "Sensitive Micromechanical Displacement Detection by Scattering Evanescent Optical Waves", "Optics Letters", May 19, 2010, pp. 1792-1794, vol. 35, No. 11, Publisher: Optical Society of America, Published in: U.S.

Groblacher, Simon et al, "Highly Efficient Coupling from an Optical Fiber to a Nanoscale Silicon Optomechanical Cavity", "Applied Physics Letters", Oct. 28, 2013, pp. 1-5, vol. 103, Publisher: AIP Publishing, LLC.

(56) References Cited

OTHER PUBLICATIONS

Lapointe, Jerome et al, "Making Smart Phones Smarter with Photonics", "Optics Express", Jun. 18, 2014, pp. 15473-15483, vol. 22, No. 13, Publisher: Optical Society of America, Published in: U.S.
European Patent Office, "Communication Pursuant to Article 94(3) for EP Application No. EP 16166097.2 dated Mar. 21, 2018", "Foreign Counterpart to U.S. Appl. No. 14/721,914", dated Mar. 21, 2018, pp. 1-5, Published in: EP.

* cited by examiner

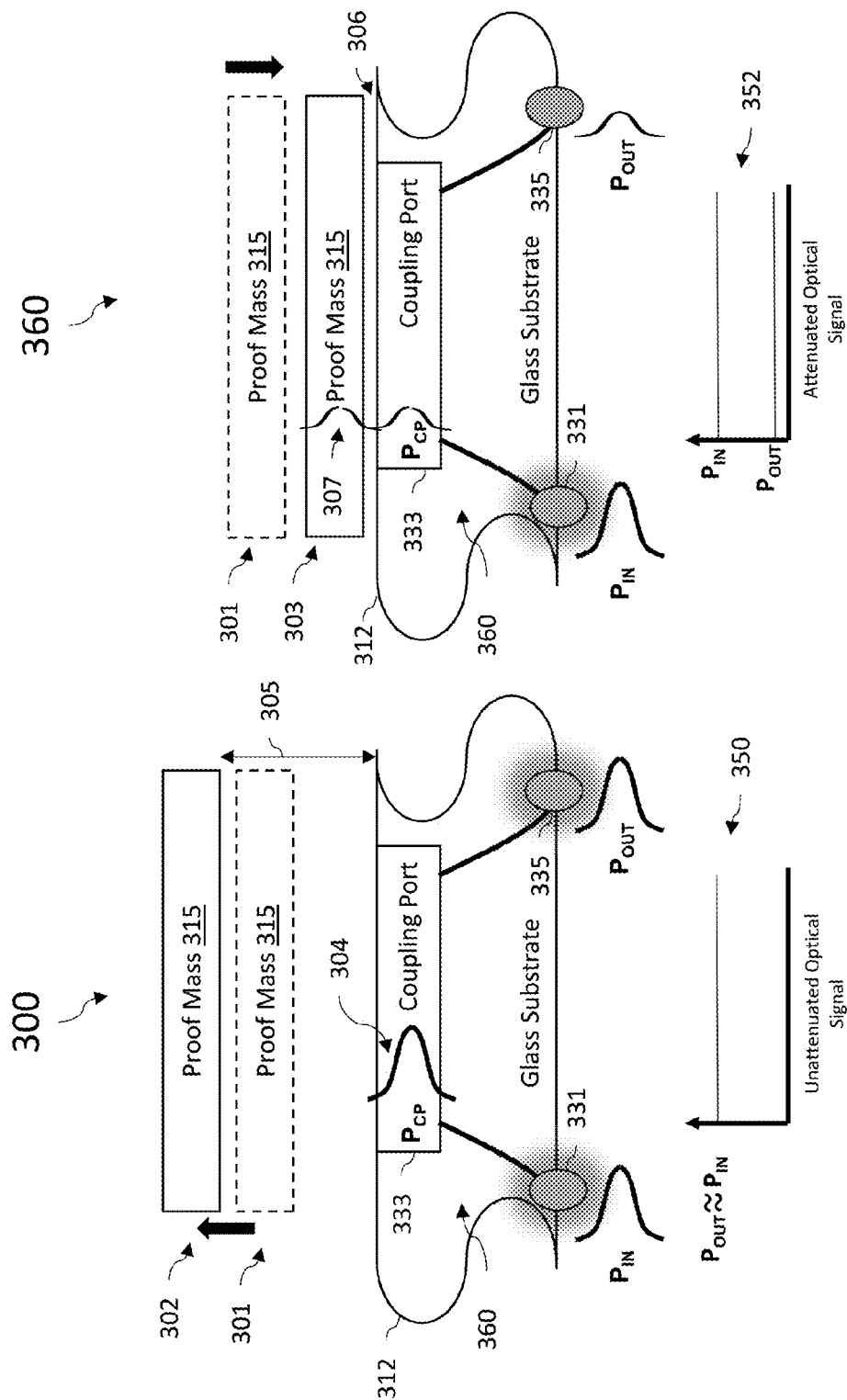

SYSTEM AND METHODS FOR HIGHLY INTEGRATED OPTICAL READOUT MEMS SENSORS

CROSS-REFERENCE TO RELATED APPLICATIONS

This application claims priority to, and the benefit of, U.S. Provisional Application No. 62/154,197 entitled "HIGHLY INTEGRATED OPTICAL READOUT MEMS SENSORS" filed on Apr. 29, 2015 and which is incorporated herein by reference in its entirety.

BACKGROUND

Capacitive readout of MEMS sensors is susceptible to a variety of error mechanisms such as electrical feed-through, electrical damping of sensor mechanical modes, glass charging, work function changes of metallic capacitive plates, etc. In addition, the scale factor (SF) of the sensor, or the amount of signal you get out divided by the input signal, is directly related to sensitivity of the readout mechanism. These two factors limit the effectiveness of capacitive readout in MEMS sensors. Optical evanescent coupling is a promising readout technique that is potentially more sensitive than its capacitive counterpart and is not vulnerable to the electrostatic error mechanisms mentioned above. However, many of the proposed methods are not rugged enough to handle the harsh environmental factors that sensors are often exposed to.

For the reasons stated above and for other reasons stated below which will become apparent to those skilled in the art upon reading and understanding the specification, there is a need in the art for alternate systems and methods for providing highly integrated optical readout MEMS sensors.

SUMMARY

The Embodiments of the present invention provide methods and systems for providing highly integrated optical readout MEMS sensors and will be understood by reading and studying the following specification.

In one embodiment, a method for an integrated waveguide optical-pickoff sensor comprises: launching a laser beam generated by a laser light source into an integrated waveguide optical-pickoff monolithically fabricated within a first substrate, the integrated waveguide optical-pickoff including an optical input port, a coupling port, and an optical output port; and detecting an amount of coupling of the laser beam from the coupling port to a sensor component separated from the coupling port by a gap by measuring an attenuation of the laser beam at the optical output port.

DRAWINGS

Embodiments of the present invention can be more easily understood and further advantages and uses thereof more readily apparent, when considered in view of the description of the preferred embodiments and the following figures in which:

FIGS. 3A and 3B are diagrams illustrating operation of an monolithic optical readout MEMS sensor of one embodiment of the present disclosure;

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present disclosure provide system and methods for monolithically integrated optical pickoffs fabricated within the glass substrate of a MEMS sensor such as, but not limited to a MEMS gyroscope. Many MEMS sensors are multi-layer structures where one layer consists of a glass substrate. Embodiments of the present disclosure can utilize processes where a femtosecond laser may be employed to "write" or pattern 3-dimensional optical waveguides in the glass substrate with relatively low loss. Utilizing this process, optical waveguides can be integrated in to the glass layer of the device.

When a moving MEMS structure is in close enough proximity to the waveguide, light is extracted out of the waveguide via evanescent coupling. The closer the moving structure is to the waveguide, the more light is coupled out of the waveguide. Thus, the amplitude of motion for a MEMS device can be derived by monitoring the light intensity output of the waveguide. The advantages of this approach are as follows. First, embodiments disclosed herein improved sensor performance by providing a more sensitive readout. Evanescent coupling and capacitive readout are sensitive to gap changes (i.e., the spacing between a moving structure and the sense mechanism) as $\sim e^{(-gap)}$, whereas a traditional capacitive pickoff is only proportional to $\sim 1/\text{gap}$. Therefore, the evanescent coupling is potentially much more sensitive to gap changes than the capacitive coupling. Embodiments disclosed herein are also relatively more stable than competing optical readout schemes due to the monolithic integration of the sensing components, fewer optical components, avoidance of dissimilar materials and better temperature stability. Finally, embodiments disclosed herein provide for the elimination of known sensor bias mechanisms due to distinct drive (electrostatic) and sense (optic) techniques.

Figure 1:
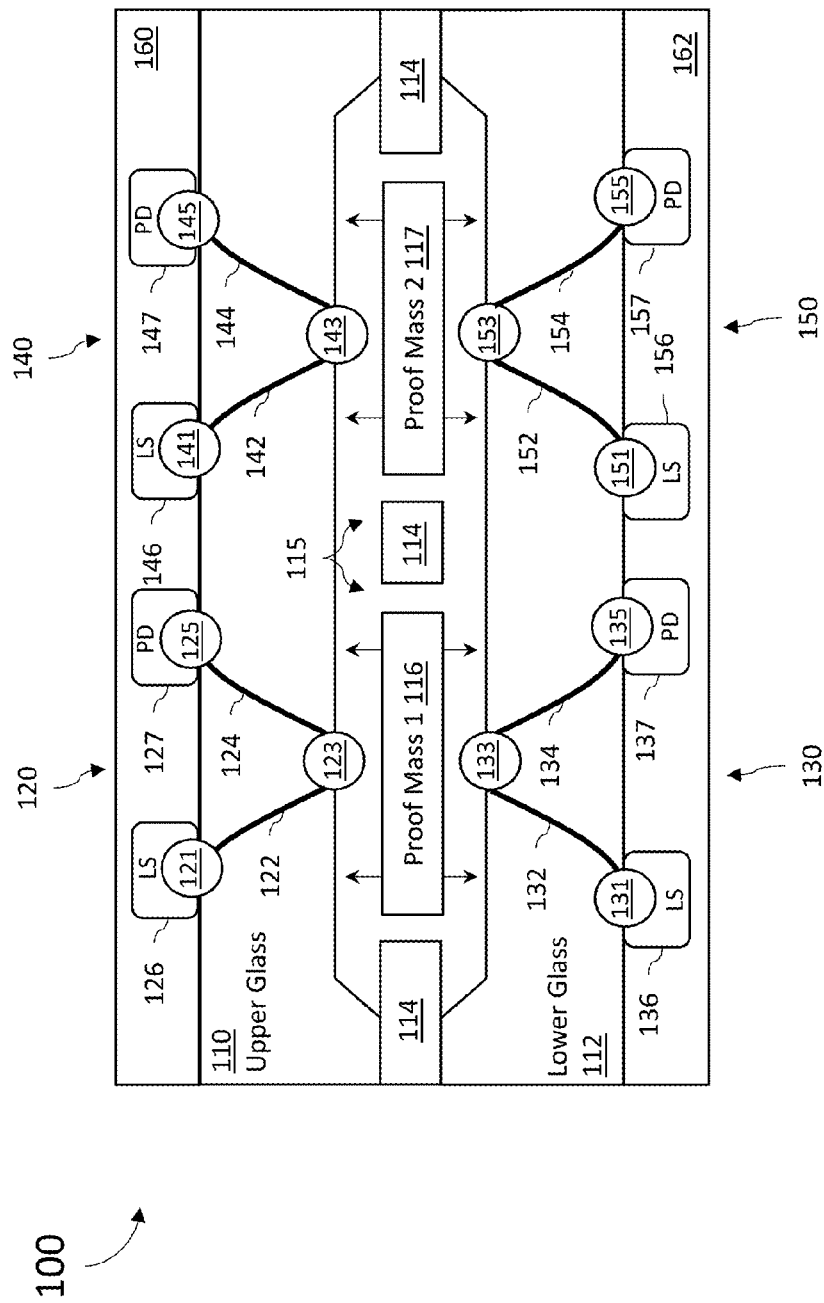
FIG. 1 is a diagram of an monolithic optical readout MEMS sensor of one embodiment of the present disclosure.

FIG. 1 is a diagram of one embodiment of the present disclosure of an integrated optical readout MEMS sensor 100. Sensor 100 comprises a gyroscope device layer 114 comprising a first proof mass 116 and a second proof mass 117. The gyroscope device layer 114 is positioned between an upper glass substrate 110 and a lower glass substrate 112 defining an open space cavity 115 within which the first proof mass 116 and second proof mass 117 each have at least one degree of freedom (1-DOF) to move within the open space cavity 115 in a direction normal to the plane of the gyroscope device layer 114. That is, while they may move with three degrees of freedom, they at least move perpendicularly into and out-of the plane of the gyroscope device layer 114 in reaction to inertial forces applied along the sensing axis of sensor 100 which is normal to the plane of the gyroscope device layer 114. Motion of proof masses 116 and 117 is measured by the integrated waveguide optical-pickoffs 120, 130, 140 and 150. As the term is used herein, "integrated waveguide" means that the optical-pickoffs 120, 130, 140 and 150 comprise waveguides monolithically integrated into the glass substrates 110 and 112. In one embodiment, these integrated waveguide elements are created using three dimensional femtosecond laser waveguide patterning into, for example, a Gorilla Glass™ material from which glass substrates 110 and 112 are fabricated.

As shown in FIG. 1, integrated waveguide optical-pickoffs 120 and 130 may be used to measure the displacement of proof mass 116. Integrated waveguide optical-pickoff 120 is fabricated within the upper glass substrate 110 over proof mass 116 and comprises an optical input port 121, a coupling port 123 and an optical output port 125. In one embodiment, one or both of optical input port 121 and optical output port 125 may comprise regions of an external surface of upper glass substrate 110 polished to facilitate low-loss entry and exit of laser light from upper glass substrate 110. Input port 121 is optically coupled to coupling port 123 by monolithically integrated waveguide 122 while coupling port 123 is further coupled to output port 125 by monolithically integrated waveguide 124. In one embodiment, coupling port 123 comprises a portion of the monolithically integrated waveguide between waveguides 122 and 124 that approaches the surface of upper glass substrate 110 within open space cavity 115 and positioned to couple light into proof mass 116 when proof mass 116 is in close proximity to coupling port 123. In one embodiment, laser light is launched into upper glass substrate 110 at input port 121 by a laser light source 126 and measured exiting upper glass substrate 110 at output port 125 by a photodetector 127.

Integrated waveguide optical-pickoff 130 is fabricated within the lower glass substrate 112 under proof mass 116 and comprises an optical input port 131, a coupling port 133 and an optical output port 135. In one embodiment, one or both of optical input port 131 and optical output port 135 may comprise regions of an external surface of lower glass substrate 112 polished to facilitate low-loss entry and exit of laser light from lower glass substrate 112. Input port 131 is optically coupled to coupling port 133 by monolithically integrated waveguide 132 while coupling port 133 is further coupled to output port 135 by monolithically integrated waveguide 134. In one embodiment, coupling port 133 comprises a portion of the monolithically integrated waveguide between waveguides 132 and 134 that approaches the surface of lower glass substrate 112 within open space cavity 115 and positioned to couple light into proof mass 116 when proof mass 116 is in close proximity to coupling port 133. In one embodiment, laser light is launched into lower glass substrate 112 at input port 131 by a laser light source 136 and measured exiting lower glass substrate 112 at output port 135 by a photodetector 137.

Also as shown in FIG. 1, integrated waveguide optical-pickoffs 140 and 150 may be used to measure the displacement of proof mass 117. Integrated waveguide optical-pickoff 140 is fabricated within the upper glass substrate 110 over proof mass 117 and comprises an optical input port 141, a coupling port 143 and an optical output port 145. In one embodiment, one or both of optical input port 141 and optical output port 145 may comprise regions of an external surface of upper glass substrate 110 polished to facilitate low-loss entry and exit of laser light from upper glass substrate 110. Input port 141 is optically coupled to coupling port 143 by monolithically integrated waveguide 142 while coupling port 143 is further coupled to output port 145 by monolithically integrated waveguide 144. In one embodiment, coupling port 143 comprises a portion of the monolithically integrated waveguide between waveguides 142 and 144 that approaches the surface of upper glass substrate 110 within open space cavity 115 and positioned to couple light into proof mass 117 when proof mass 117 is in close proximity to coupling port 143. In one embodiment, laser light is launched into upper glass substrate 110 at input port 141 by a laser light source 146 and measured exiting upper glass substrate 110 at output port 145 by a photodetector 147.

Integrated waveguide optical-pickoff 150 is fabricated within the lower glass substrate 112 under proof mass 117 and comprises an optical input port 151, a coupling port 153 and an optical output port 155. In one embodiment, one or both of optical input port 151 and optical output port 155 may comprise regions of an external surface of lower glass substrate 112 polished to facilitate low-loss entry and exit of laser light from lower glass substrate 112. Input port 151 is optically coupled to coupling port 153 by monolithically integrated waveguide 152 while coupling port 153 is further coupled to output port 155 by monolithically integrated waveguide 154. In one embodiment, coupling port 153 comprises a portion of the monolithically integrated waveguide between waveguides 152 and 154 that approaches the surface of lower glass substrate 112 within open space cavity 115 and positioned to couple light into proof mass 117 when proof mass 117 is in close proximity to coupling port 153. In one embodiment, laser light is launched into lower glass substrate 112 at input port 151 by a laser light source 156 and measured exiting lower glass substrate 112 at output port 155 by a photodetector 157.

Laser light sources 126, 136, 146 and 156 and photodetectors 127, 137, 147 and 157 are electrical devices which may be either integrated into the device package housing sensor 100, or alternately may be fabricated within interposer layers 160 and 162 (or other physical layers) that interface with the external upper and lower surfaces of upper glass substrate 110 and lower glass substrate 112, respectively. In one implementation, laser light sources 126, 136, 146 and 156 are each light emitting diode (LED) laser light sources.

Figure 2:
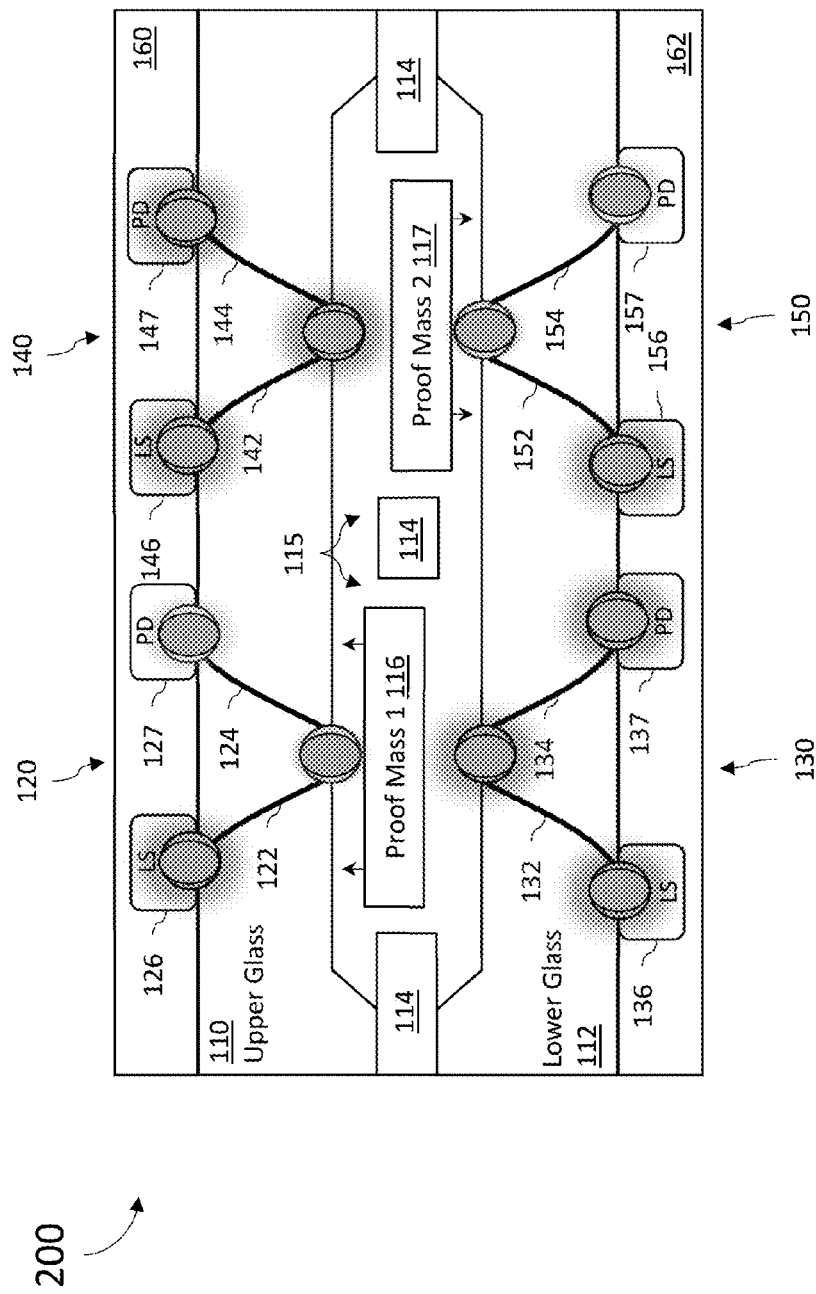
FIG. 2 is a diagram operation of an monolithic optical readout MEMS sensor of one embodiment of the present disclosure.

When sensor 100 is exposed to inertial forces, proof masses 116 and 117 will be displaced from their positions within the plane of gyroscope device layer 114 a distance that is directly proportional to the magnitude of the inertial forces. One example of such a displacement caused by rotational acceleration around the rotation axis of sensor 100 is illustrated in FIG. 2, where proof mass 116 is displaced towards upper glass substrate 110 (and away from lower glass substrate 112) while proof mass 117 is displaced toward lower glass substrate 112 (and away from upper glass substrate 110). Laser light sources 126, 136, 146 and 156 each launch a laser light beam into their respective optical input ports that propagates to their respective photodetectors 127, 137, 147 and 157 via the monolithically integrated waveguides 122, 124, 132, 134, 142, 144 and 152, 154. The intensity of the laser light beams reaching photodetectors 127, 137, 147 and 157 may be used to determine the deflection experienced by proof masses 116 and 117 due to the inertial force, and therefore the electrical output signals from photodetectors 127, 137, 147 and 157 may ultimately be used to obtain measurements of that inertial force.

For example, FIG. 3A illustrates at 300 an example operation of any of an integrated waveguide optical-pickoff 360, which may represent any of the integrated waveguide optical-pickoffs 120, 130, 140 and 150 discussed above. In the example of FIG. 3A, proof mass 315 (which may represent, for example, either proof mass 116 or 117) is deflected away from a coupling port 333. This would be the case for the example displacement of either of the integrated waveguide optical-pickoffs 130 and 140 in FIG. 2. Here, the integrated waveguide optical-pickoff 360 is monolithically fabricated within a glass substrate 312 and comprises an optical input port 331, a coupling port 333 and an optical input port 335. Due to inertial forces, proof mass 315 is deflected from its rest position 301 to a deflected position 302 (away from coupling port 333) a distance that is proportional to the magnitude of the inertial force. This deflection away from coupling port 333 decreases the optical coupling between proof mass 315 and coupling port 333 (illustrated at 304) so that laser light of intensity $P_{IN}$ launched into input port 331 reaches output port 335 with little to no attenuation (illustrated by the graph at 350). In fact, because evanescent readout from output port 335 is attenuated as an exponential function of the gap distance 305 between the proof mass 315 and coupling port 333 (i.e., $k \sim e^{-gap\ distance}$) the attenuating affect at output port 335 due to optical coupling between proof mass 315 and coupling port 333 quickly becomes negligible as the gap distance 305 increases.

In contrast, FIG. 3B illustrates at 360 an example operation where the proof mass 315 is deflected toward coupling port 333. This would be the case for integrated waveguide optical-pickoffs 120 and 150 in FIG. 2. Due to inertial forces, proof mass 315 is now deflected from its rest position 301 to a deflected position 303 (that is, towards coupling port 333) a distance that is proportional to the magnitude of the inertial force. This deflection towards coupling port 333 increases the optical coupling between proof mass 315 and coupling port 333 (illustrated at 307) so that some portion of laser light of intensity $P_{IN}$ launched into input port 331 is coupled into proof mass 315 and does not reach output port 335. The result is an attenuation in the intensity of the laser light that does reach output port 335. Because evanescent readout from output port 335 is attenuated as an exponential function of the gap distance 306 between the proof mass 315 and coupling port 333 (i.e., $k \sim e^{-gap\ distance}$) the attenuating affect at output port 335 due to optical coupling between proof mass 315 and coupling port 333 quickly increases as the gap distance 306 decreases.

With embodiments of the present disclosure, the utilization of integrated waveguide optical-pickoffs fabricated within the material of the upper and lower glass substrates of a MEMS sensor provide readout stability comparable to those provided by capacitive pickoffs but with the improved sensitive that can be achieved with optical pickoffs while avoiding stability errors that might otherwise be introduced from incorporating different optical materials to realize the optical pickoffs. The various embodiments described herein provide improved performance due to more sensitive readout, stable optical readout schemes due to monolithic integration, need relatively fewer optical components, avoid dissimilar materials and provide improvements in temperature stability. The monolithic integration provides improved gun hardness over electrostatic readout MEMS gyroscopes and elimination of known bias mechanisms due to distinct drive (electric) and sense (optic) techniques that eliminate drive to sense feed through mechanisms. These embodiments also provide for a more sensitive pickoff (>10×) as compared to capacitive pickoffs, an increase in gyro scale factor leading to improved device performance, and allows proof mass springs to be more rigid to survive higher g levels without sacrificing performance.

Figure 4A:
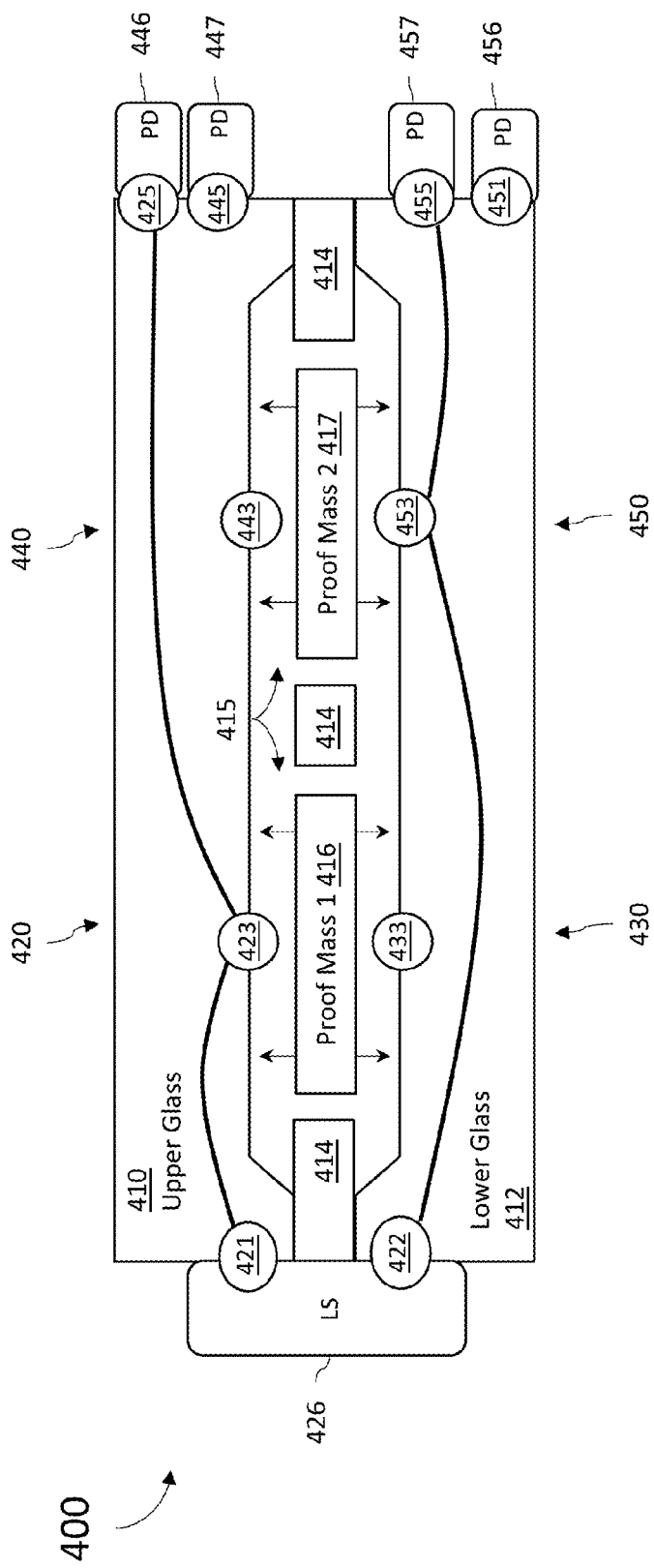
FIGS. 4A, 4B, 4C and 4D are a diagrams of an alternate monolithic optical readout MEMS sensor of one embodiment of the present disclosure.
Figure 4B:
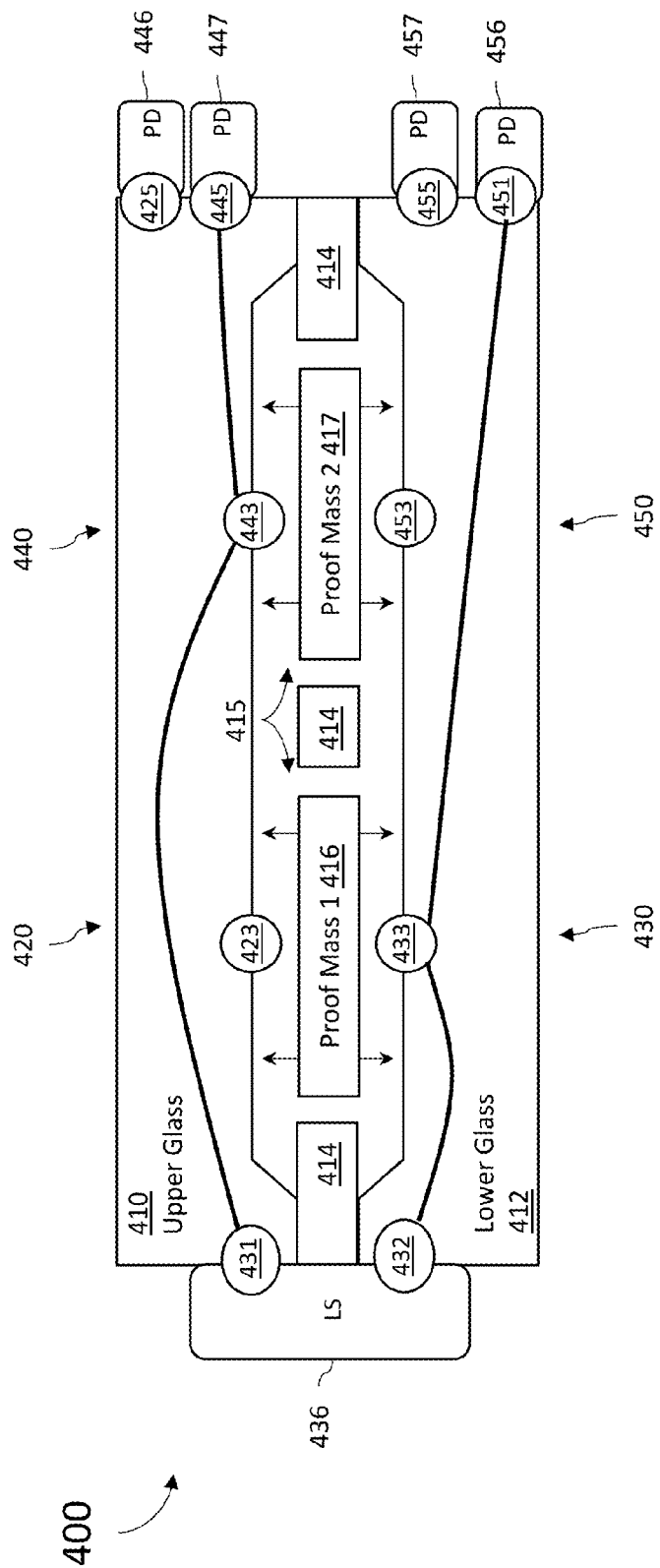

FIGS. 4A and 4B are diagrams of an alternate monolithic optical readout MEMS sensor 400 of one embodiment of the present disclosure. In one embodiment, optical readout MEMS sensor 400 provides an alternate implementation of sensor 100. Therefore, the description of like named elements in FIGS. 1 and 2 apply to sensor 400 and vise versa. In some implementations, the elements described in FIGS. 4A and 4B may be used in conjunction with, in combination with, or as substitutes for like named elements in FIGS. 1 and 2. Sensor 400 comprises a gyroscope device layer 414 comprising a first proof mass 416 and a second proof mass 417. The gyroscope device layer 414 is positioned between an upper glass substrate 410 and a lower glass substrate 412 defining an open space cavity 415 within which the first proof mass 416 and second proof mass 417 each have at least one degree of freedom (1-DOF) to move within the open space cavity 415 in a direction normal to the plane of the gyroscope device layer 414 in the same manner as described above with respect to proof masses 116 and 117. That is, while they may move with three degrees of freedom, they at least move perpendicularly into and out-of the plane of the gyroscope device layer 414 in reaction to inertial forces applied along the sensing axis of sensor 400 which is normal to the plane of the gyroscope device layer 414. Motion of proof masses 416 and 417 is measured by the integrated waveguide optical-pickoffs 420, 440, 440 and 450.

As opposed to sensor 100, sensor 400 utilizes two laser light sources 426 and 436 which are mounted to the sides of respective glass substrates 410 and 412 rather than in an interposer layer above or below respective glass substrates 410 and 412. As illustrated in FIG. 4A, laser light source 426 launches its laser light into glass substrate 410 via input port 421, and into glass substrate 412 via input port 422. Because laser light source 426 is coherent, both optical input ports 421 and 422 are effectively seeing the same light. The laser light entering optical input port 421 propagates to coupling port 423 of optical pickoff 420 (to measure deflection of proof mass 416) and while the laser light entering optical input port 422 propagates to coupling port 453 of optical pickoff 450 (to measure deflection of proof mass 417). Coupling port 423 is coupled to optical output port 425 and the intensity of light reaching optical output port 425 is measured by photodetector 446. Coupling port 453 is coupled to optical output port 455 and the intensity of light reaching optical output port 455 is measured by photodetector 457. As illustrated in FIG. 4B, laser light source 436 launches its laser light into glass substrate 410 via input port 431, and into glass substrate 412 via input port 432. Again, because laser light source 436 is coherent, both optical input ports 431 and 432 are effectively seeing the same light. It should be appreciated that for some implementations, the laser light source 436 and laser light source 426 may be implemented using the same laser producing device, while in other implementations they are independent laser light sources. The laser light entering optical input port 431 propagates to coupling port 443 of optical pickoff 440 (to measure deflection of proof mass 417) while the laser light entering optical input port 432 propagates to coupling port 433 of optical pickoff 430 (to measure deflection of proof mass 416). Coupling port 443 is coupled to optical output port 445 and the intensity of light reaching optical output port 445 is measured by photodetector 447. Coupling port 433 is coupled to optical output port 451 and the intensity of light reaching optical output port 451 is measured by photodetector 456. As with sensor 100, coupling of each of the input ports, coupling ports and output ports is achieved with integrated waveguides within glass substrates 410 and 412 that define the integrated waveguide optical-pickoffs 420, 430, 440 and 450. That is, optical-pickoffs 420, 430, 440 and 450 comprise waveguides monolithically integrated into the glass substrates 410 and 412. In one embodiment, similar to optical input ports 421 and 431, optical output ports 425, 445, 455 and 451 are fabricated on the sides of glass substrates 410 and 412 rather than the top and bottom surfaces of glass substrates 410 and 412, and photodetectors 446, 447, 457 and 456 mounted receive light exiting from those output ports.

Figure 4C:
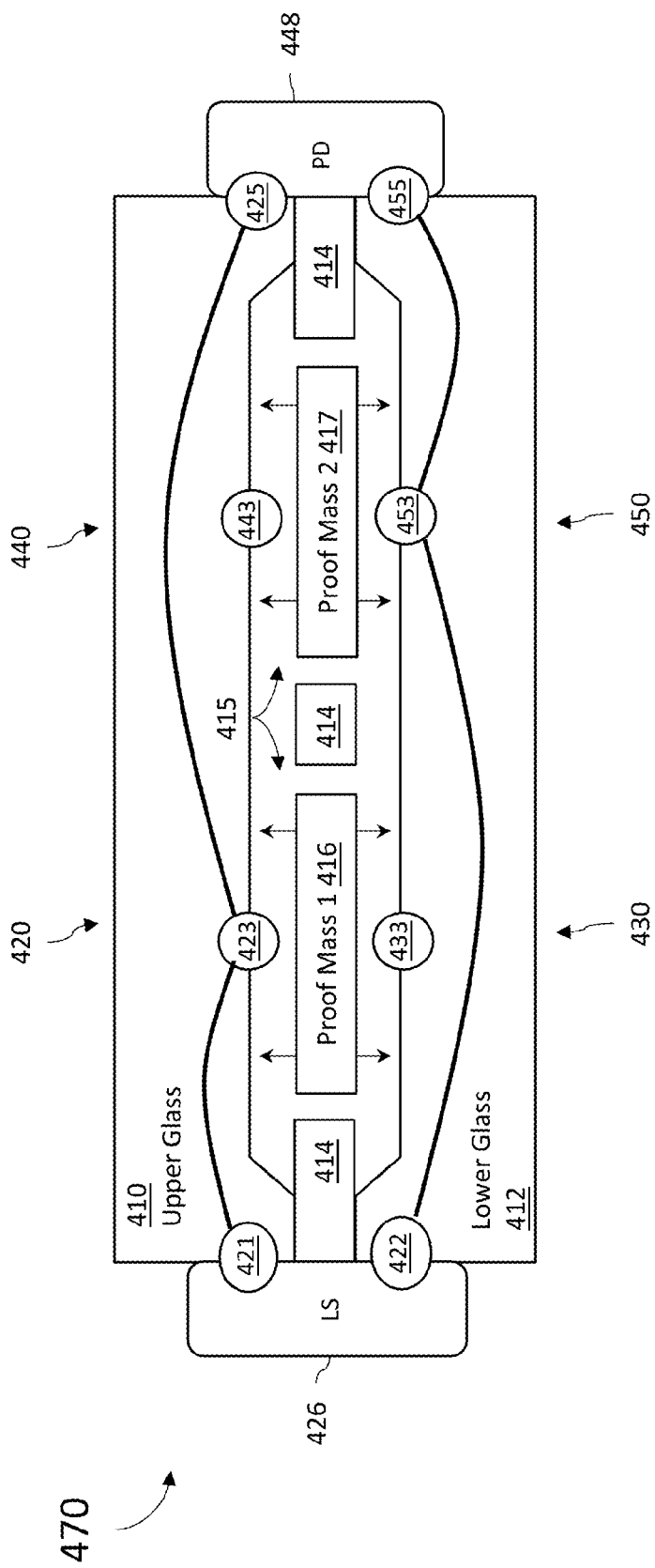
Figure 4D:
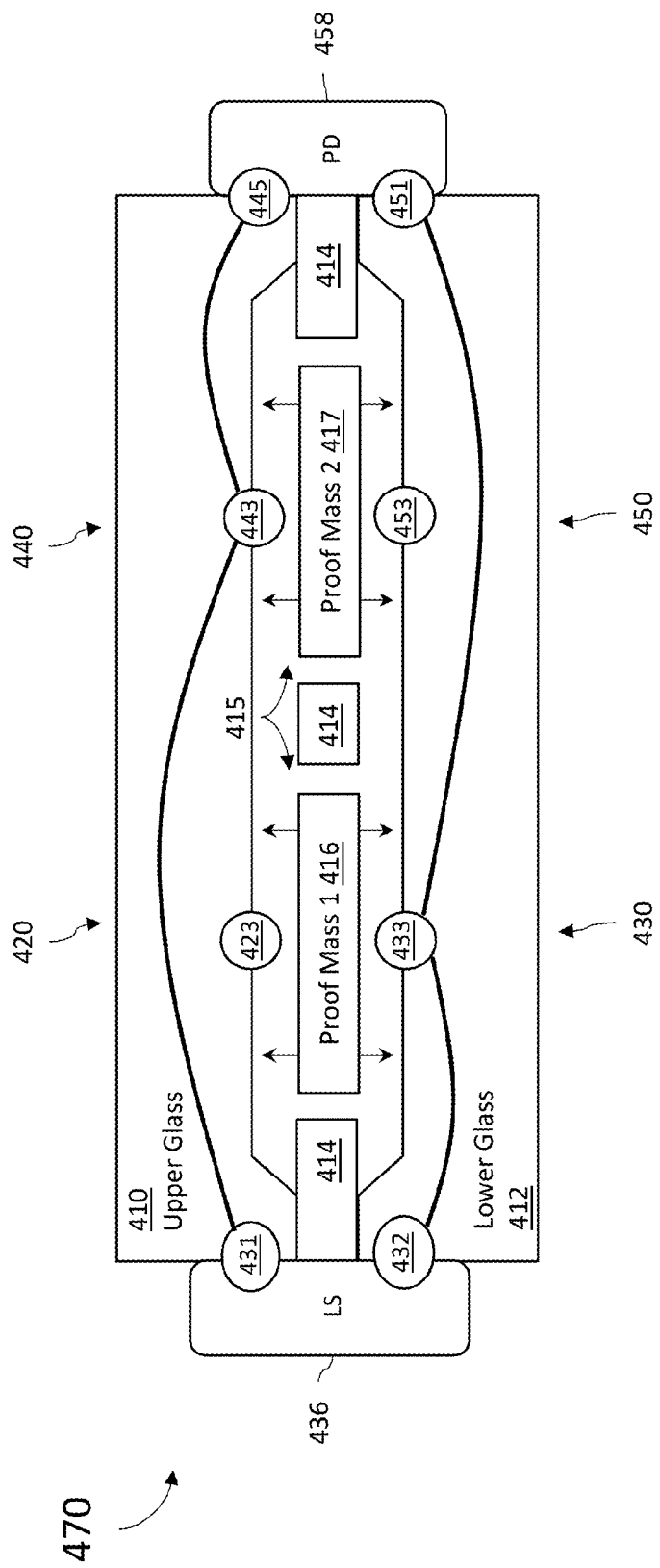

It should also be appreciated that in another embodiment, outputs 425 and 455 may be combined together so that a single photodetector can take the place of 446 and 457. In the same way, outputs 445 and 451 may be combined together so that a single photodetector can take the place of 447 and 456. Such an embodiment is illustrated in FIGS. 4C and 4D by sensor 470. Sensor 470 is identical to sensor 400 expect: 1) the two separate photodetectors 446 and 457 in sensor 400 are replaced by the single photodetector 448 that measures the optical intensity received for the total light received at the two optical output ports 425 and 455; and 2) the two separate photodetectors 447 and 456 in sensor 400 are replaced by the single photodetector 458 that measures the optical intensity received for the total light received at the two optical output ports 445 and 451. The way sensor 470 reacts to rotational forces, proof masses 416 and 417 will move in opposite directions (i.e., out-of-phase with each other) as described above with respect to FIG. 2. So by utilizing a single photodetector 448 to monitor both optical pickoffs 420 and 450, and another single photodetector 458 to monitor both optical pickoffs 420 and 440, the sensor 470 is effectively measuring the same effect twice. One advantage associated with the embodiment of FIGS. 4C and 4D is that a smaller number of photodetectors are needed, reducing cost and complexity, but also reducing signal noise in the measurement. That is, in the embodiment of FIGS. 4A and 4B, four separate photodetectors are utilized, one for each of the optical-pickoffs 420, 430, 440 and 450. Each of those photodetectors represent separate contributors of uncorrelated noise to the measurement. By utilizing just two photodetectors as show in FIGS. 4C and 4D instead of four, the number of potential sources of uncorrelated noise contribution is cut in half. In contrast, one advantage of separately measuring the output of each of the optical-pickoffs 420, 430, 440 and 450 with separate photodetectors is that non-ideal or anomalous motions of the proof masses 416 and 417 can be detected without masking that may come from combining signals.

Figure 5:
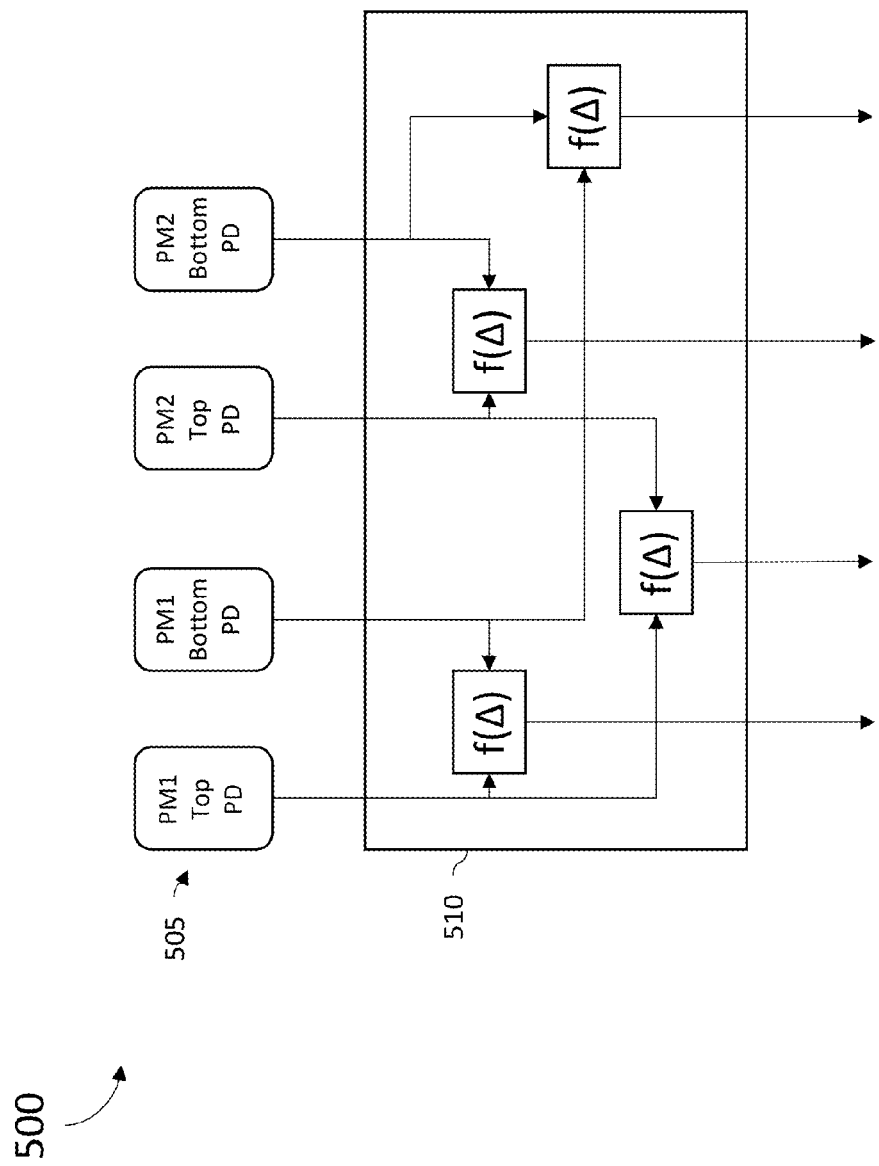
FIG. 5 is a diagram illustrating optical pickoff signal processing of one embodiment of the present disclosure.

FIG. 5 is a diagram illustrating generally at 500 optical pickoff signal processing of one embodiment of the present disclosure. For any of the embodiments described herein, electrical output of the photodetectors (shown generally at 505) associated with each of the integrated waveguide optical-pickoffs may be processed by electronics 510 using either analog or digital means, or a combination thereof, to cancel out common mode or other errors. For example, electronics 510 may determine displacement of a first proof mass based on a function of the difference between outputs from the photodetectors (PM1 Top PD and PM1 Bottom PD) associated with the first proof mass. Similarly, electronics 510 may determine displacement of a second proof mass based on a function of the difference between outputs from the photodetectors (PM2 Top PD and PM2 Bottom PD) associated with the second proof mass. Other sensor measurements may be achieved by considering combined deflections of both proof masses. For example, electronics 510 may determine an inertial measurement or correction factor based on a function of the difference between outputs from a top substrate photodetector for the first proof mass (PM1 Top PD) and a bottom substrate photodetector for the second proof mass (PM2 Bottom PD). Similarly, electronics 510 may determine an inertial measurement or correction factor based on a function of the difference between outputs from a bottom substrate photodetector for the first proof mass (PM1 Bottom PD) and a top substrate photodetector for the second proof mass (PM2 Top PD).

Figure 6:
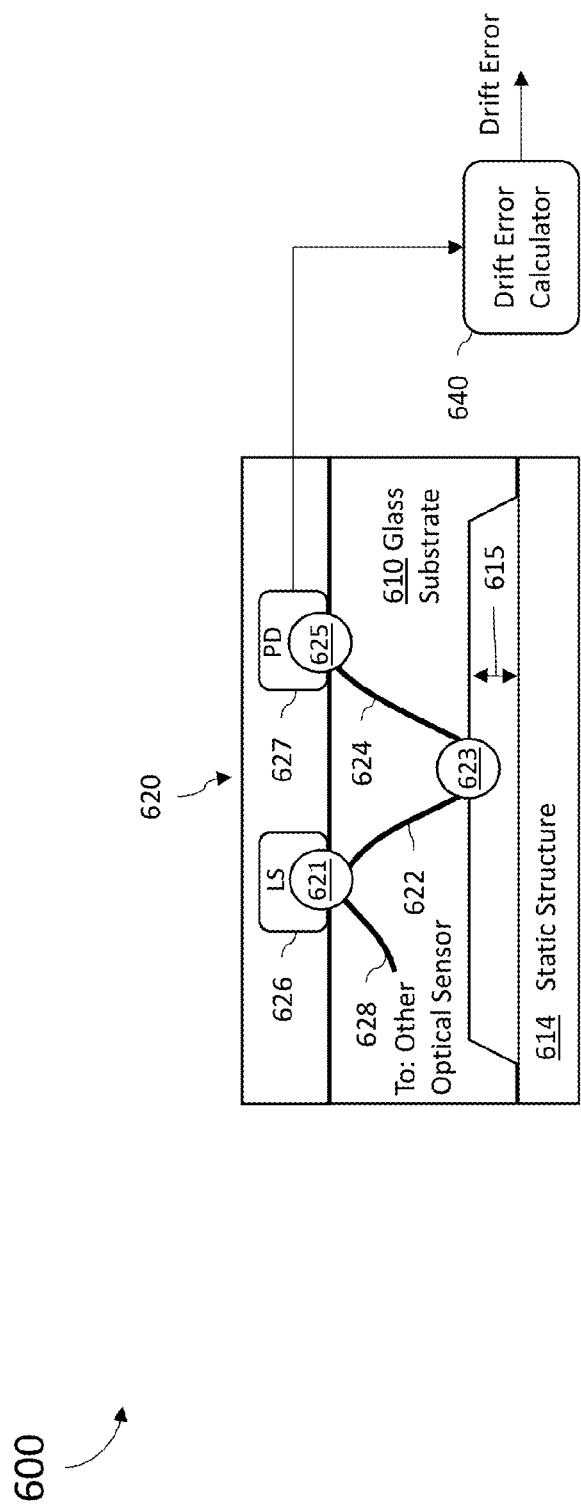
FIG. 6 is a diagram illustrating an optical pickoff drift sensor of one embodiment of the present disclosure.

While the disclosure above describes illustrative embodiments of monolithically integrated optical pickoffs used to measure the motion of a moving part (for example, the moving proof masses), it should be noted that in still other embodiments, monolithically integrated optical pickoffs may be utilized for other applications, in conjunction with features that don't intentionally move. For example, FIG. 6 is a diagram illustrating an integrated waveguide optical pickoff drift sensor 600 of one embodiment of the present disclosure. Sensor 600 comprises a static structure layer 614 positioned adjacent to a glass substrate 610. In the embodiment of FIG. 6, a first gap 615 defines a fixed distance open space between upper glass substrate 610 and static structure layer 614. Sensor 600 further comprises an integrated waveguide optical-pickoff 620 which includes waveguide elements monolithically integrated into the glass substrate 610. In one embodiment, these integrated waveguide elements are created using three dimensional femtosecond laser waveguide patterning into, for example, a Gorilla Glass™ material from which glass substrate 610 is fabricated.

Integrated waveguide optical-pickoff 620 is fabricated within the upper glass substrate 610 over static structure layer 614 and comprises an optical input port 621, a coupling port 623 and an optical output port 625. In one embodiment, one or both of optical input port 621 and optical output port 625 may comprise regions of an external surface of upper glass substrate 610 polished to facilitate low-loss entry and exit of laser light from upper glass substrate 610. Input port 621 is optically coupled to coupling port 623 by monolithically integrated waveguide 622 while coupling port 623 is further coupled to output port 625 by monolithically integrated waveguide 624. In one embodiment, coupling port 623 comprises a portion of the monolithically integrated waveguide between waveguides 622 and 624 that approaches the surface of upper glass substrate 610 within gap space 615 and positioned to couple light into static structure layer 614. In one embodiment, laser light is launched into upper glass substrate 610 at input port 621 by a laser light source 626 and measured exiting upper glass substrate 610 at output port 625 by photodetector 627. Laser light source 626 may also be used in conjunction with one or more other optical sensors (such as MEMS sensors 100 or 400 described above) and provide laser light to an element of such sensor via the integrated waveguide 628.

Using such an integrated waveguide optical-pickoff as shown in FIG. 6, optical evanescent coupling may be utilized to detect changes in the optical intensity at the optical output port 625 that may be caused by phenomena such as drift in the laser light provided by the laser light source. Utilization of such monolithically integrated optical pickoffs to measure a constant gap between stationary elements may be used to calibrate out those kinds of drift in moving parts of the device. That is, because gap 615 is a constant gap, any changes in optical coupling between coupling port 623 and static structure layer 614 is due to drift in the optical power of laser light from laser light source 626. In one embodiment, the electrical signal output of photodetector 627 is provided to a bias error calculator 640 to calculate a bias error. In one embodiment, the bias error output from bias error calculator 640 may be fed into electronics 510 and included in calculations for generating inertial measurements.

For example, referring to FIG. 6 and FIGS. 3A and 3B, if in one embodiment laser light source 626 is also the source of laser light to optical input port 231, then changes in intensity measured at photodetector 627 (and converted to a bias error by bias error calculator 540) may be used to detect changes in optical intensity measured at optical output port 235 that are due to laser light drift rather than changes in proof mass 215 position. By subtracting out the bias error, what then remains is a true measure of the deflection of proof mass 215.

Figure 7:
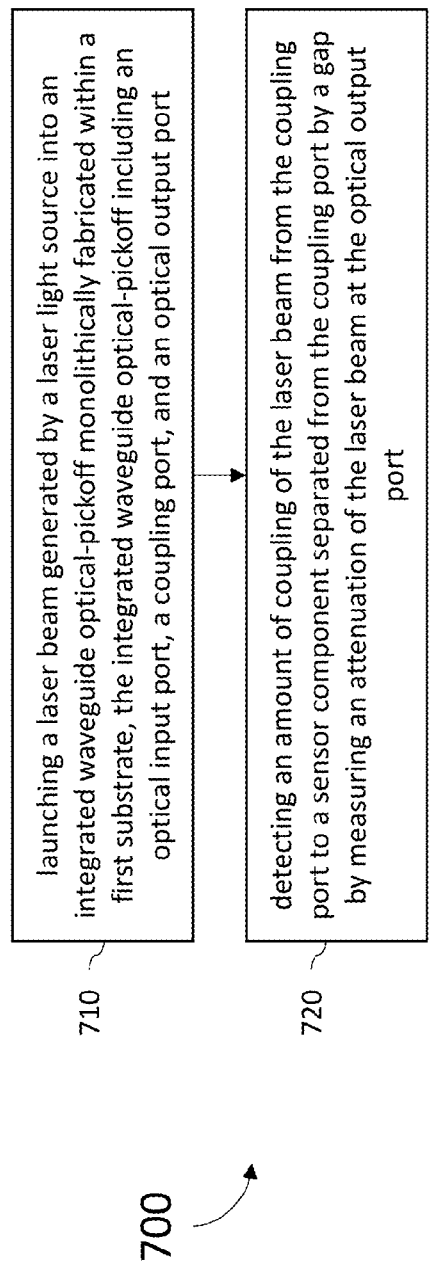
FIG. 7 is a flow chart illustrating a method of one embodiment of the present disclosure.

FIG. 7 is a flow chart illustrating a method 700 of one embodiment of the present disclosure. The method of 700 may be implemented using one or more elements of the various preceding embodiments described herein and may be used in conjunction with, or in combination with, any of the embodiments described with respect to FIGS. 1-6. As such, the disclosures provided above with respect to like named elements above apply the method 700 and vise verse.

The method begins at 710 with launching a laser beam generated by a laser light source into an integrated waveguide optical-pickoff monolithically fabricated within a first substrate, the integrated waveguide optical-pickoff including an optical input port, a coupling port, and an optical output port. As the term is used herein, "integrated waveguide" means that the optical-pickoffs comprises one or more waveguides monolithically integrated into the first substrate, which may comprises a silicon glass substrates. In one embodiment, these integrated waveguide elements are created using three dimensional femtosecond laser waveguide patterning into, for example, a Gorilla Glass™ material from which the first substrates is fabricated.

The method proceeds to 720 with detecting an amount of coupling of the laser beam from the coupling port to a sensor component separated from the coupling port by a gap by measuring an attenuation of the laser beam at the optical output port. In one embodiment, the sensor component is a moving sensor component such as a proof mass of an inertial sensors (such as any of the proof masses described above) which may form part of a gyroscope device layer. The moving sensor component may be positioned within an open space cavity at least partially provided by the first substrate within which the first proof mass may have a degree of freedom of movement in reaction to inertial forces applied along the sensing axis of the sensor which is normal to the plane of the gyroscope device layer. Motion of the sensor component is measured by the integrated waveguide optical-pickoff by sensing the amount of light coupled from the coupling port to the sensor component. Changes in the attenuation of light received at the optical output port are indications of changes in the gap between the moving sensor component and the coupling port, which may be converted to an electrical signal (i.e., via a photodetector) and processed as described above to generate an inertial measurement.

In other embodiments, the sensor component is a non-moving sensor component, for example, such as the integrated waveguide optical pickoff drift sensor 600 described in FIG. 6. In that case, the sensor component may be implemented using a static structure layer positioned adjacent to the first substrate having a first gap that defines a fixed distance open space between the first substrate and the static sensor component. Using such an integrated waveguide optical-pickoff, optical evanescent coupling may be utilized to detect changes in the optical intensity at the optical output port that may be caused by phenomena such as, but not limited to, drift in the laser light provided by the laser light source or temperature transients. Utilization of such monolithically integrated optical pickoffs to measure a constant gap between stationary elements may be used to calibrate out those kinds of bias sources in moving parts of the device. That is, because the gap between the coupling port and the sensor component is intended to be a constant gap, any changes in optical coupling between coupling port and static structure layer can be attributed to drift in the optical power of laser light from laser light source or other bias. In one embodiment, the electrical signal output of a photodetector coupled to the optical output port is provided to a bias error calculator to calculate the bias error. In one embodiment, the bias error output may be fed into the sensor electronics and included in calculations for generating inertial measurements. For example, referring to FIG. 6 and FIGS. 3A and 3B, if in one embodiment laser light source 626 is also the source of laser light to optical input port 231, then changes in intensity measured at photodetector 627 (and converted to a bias error by bias error calculator 540) may be used to detect changes in optical intensity measured at optical output port 235 that are due to laser light drift rather than changes in proof mass 215 position. By subtracting out the bias error, what then remains is a true measure of the deflection of proof mass 215.

Example Embodiments

Example 1 includes a method for an integrated waveguide optical-pickoff sensor, the method comprising: launching a laser beam generated by a laser light source into an integrated waveguide optical-pickoff monolithically fabricated within a first substrate, the integrated waveguide optical-pickoff including an optical input port, a coupling port, and an optical output port; and detecting an amount of coupling of the laser beam from the coupling port to a sensor component separated from the coupling port by a gap by measuring an attenuation of the laser beam at the optical output port.

Example 2 includes the method of example 1, wherein the sensor component is a static structure, the method further comprising: determining a drift in the laser beam as generated by the laser light source as a function of the attenuation of the laser beam at the optical output port due to coupling of the laser beam into the static structure.

Example 3 includes the method of example 2, further comprising: correcting an inertial sensor measurement based on the attenuation of the laser beam, wherein the inertial sensor measurement was obtained from a second integrated waveguide optical-pickoff coupled to the laser light source.

Example 4 includes the method of any of examples 1-3, wherein the sensor component is a moving sensor component.

Example 5 includes the method of example 4, wherein the moving sensor component is a micro-electromechanical system (MEMS) inertial sensor proof mass.

Example 6 includes the method of example 5, further comprising: outputting an inertial acceleration measurement based on change in the attenuation of the laser beam at the optical output port due to a displacement of the MEMS inertial sensor proof mass.

Example 7 includes the method of any of examples 1-6, wherein measuring an attenuation of the laser beam at the optical output port further comprises: measuring the attenuation using a photodetector coupled to the optical output port; and processing an electrical output of the photodetector.

Example 8 includes the method of any of examples 1-7, wherein launching a laser beam generated by a laser light source further comprises: launching the laser beam generated by the laser light source into at least a second integrated waveguide optical-pickoff monolithically fabricated within a second substrate, the second integrated waveguide optical-pickoff including a second coupling port, and a second optical output port; and detecting an amount of coupling of the laser beam from the second coupling port to a second sensor component separated from the second coupling port by a second gap by measuring an attenuation of the laser beam at the second optical output port.

Example 9 includes the method of example 8, wherein the sensor component is a micro-electromechanical system (MEMS) inertial sensor proof mass, and the second sensor component is a second MEMS inertial sensor proof mass.

Example 10 includes the method of any of examples 1-9, wherein the laser light source is fabricated within an interposer layer adjacent to the first substrate.

Example 11 includes the method of any of examples 1-10, wherein the laser light source is a light-emitting diode (LED).

Example 12 includes an integrated optical read out sensor, the sensor comprising: at least a first glass substrate; an integrated waveguide optical-pickoff monolithically fabricated within the first substrate and comprising an optical input port, a coupling port, and an optical output port; a moving sensor component adjacent to the coupling port and having a degree-of-freedom of motion in a direction perpendicular to the coupling port of the integrated waveguide; a laser light source that launches light into the first glass substrate via the optical input port, wherein a portion of the light couples from the coupling port to the moving sensor component as a function of a gap distance between the coupling port and the moving sensor component; at least one photodetector coupled to the optical output port; and electronics coupled to the at least one photodetector that calculates a measurement based on an attenuation of optical intensity of the light exiting from the optical output port, wherein the attenuation is at least in part a function of the gap distance.

Example 13 includes the sensor of example 12, wherein the moving sensor component is a micro-electromechanical system (MEMS) inertial sensor proof mass.

Example 14 includes the sensor of any of examples 12-13, wherein the laser light source is fabricated within an interposer layer adjacent to the first substrate Example 15 includes the sensor of any of examples 12-14, further comprising: an integrated waveguide optical pickoff drift sensor coupled to the laser light source, the integrated waveguide optical pickoff drift sensor comprising: a second coupling port, and a second optical output port; a static structure separated from the second optical output port by a second gap having a fixed distance; and a second photodetector coupled to the second optical output port; wherein a portion of the light couples from the second coupling port across the second gap to the static structure.

Example 16 includes the sensor of example 15, further comprising: a drift error calculator coupled to the second photodetector, wherein the drift error calculator calculates an error based on an attenuation of optical intensity of the light exiting from the second optical output port.

Example 17 includes the sensor of example 16, wherein the electronics calibrates the measurement based on the drift error.

Example 18 includes the sensor of any of examples 12-17, further comprising: a second glass substrate; a second integrated waveguide optical-pickoff monolithically fabricated within the second substrate and comprising a second coupling port, and a second optical output port; a second moving sensor component adjacent to the second coupling port and having a degree-of-freedom of motion in a direction perpendicular to the second coupling port; wherein the laser light source further launches light into the second glass substrate, wherein a portion of the light couples from the second coupling port to the second moving sensor component as a function of a second gap distance between the second coupling port and the second moving sensor component.

Example 19 includes the sensor of example 18, the electronics further coupled to the second photodetector, wherein the electronics further calculates the measurement based on attenuation of optical intensity of the light exiting from the second optical output port, wherein the attenuation of optical intensity of the light exiting from the second optical output port is at least in part a function of the second gap distance.

Example 20 includes the sensor of any of examples 12-19, wherein the laser light source is a light-emitting diode (LED).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

We claim:

1. A method for an integrated waveguide optical-pickoff sensor, the method comprising:
    launching a laser beam generated by a laser light source into an integrated waveguide optical-pickoff monolithically fabricated within a first substrate, the integrated waveguide optical-pickoff including an optical input port, a coupling port, and an optical output port; and
    detecting an amount of coupling of the laser beam from the coupling port to a sensor component separated from the coupling port by a gap by measuring an attenuation of the laser beam at the optical output port;
    wherein the laser light source is a laser diode fabricated within an interposer layer that interfaces with a surface of the first substrate.

2. The method of claim 1, wherein the sensor component is a moving sensor component.

3. The method of claim 2, wherein the moving sensor component is a micro-electromechanical system (MEMS) inertial sensor proof mass.

4. The method of claim 3, further comprising:
outputting an inertial acceleration measurement based on change in the attenuation of the laser beam at the optical output port due to a displacement of the MEMS inertial sensor proof mass.

5. The method of claim 1, wherein measuring an attenuation of the laser beam at the optical output port further comprises:
measuring the attenuation using a photodetector coupled to the optical output port; and
processing an electrical output of the photodetector.

6. The method of claim 1, wherein launching a laser beam generated by a laser light source further comprises:
launching the laser beam generated by the laser light source into at least a second integrated waveguide optical-pickoff monolithically fabricated within a second substrate, the second integrated waveguide optical-pickoff including a second coupling port, and a second optical output port; and
detecting an amount of coupling of the laser beam from the second coupling port to a second sensor component separated from the second coupling port by a second gap by measuring an attenuation of the laser beam at the second optical output port.

7. The method of claim 6, wherein the sensor component is a micro-electromechanical system (MEMS) inertial sensor proof mass, and the second sensor component is a second MEMS inertial sensor proof mass.

8. The method of claim 1, wherein the laser light source is a light-emitting diode (LED).

9. An integrated optical read out sensor, the sensor comprising:
at least a first glass substrate;
an integrated waveguide optical-pickoff monolithically fabricated within the first substrate and comprising an optical input port, a coupling port, and an optical output port;
a moving sensor component adjacent to the coupling port and having a degree-of-freedom of motion in a direction perpendicular to the coupling port of the integrated waveguide;
a laser light source that launches light into the first glass substrate via the optical input port, wherein a portion of the light couples from the coupling port to the moving sensor component as a function of a gap distance between the coupling port and the moving sensor component;
at least one photodetector coupled to the optical output port; and
electronics coupled to the at least one photodetector that calculates a measurement based on an attenuation of optical intensity of the light exiting from the optical output port, wherein the attenuation is at least in part a function of the gap distance;
wherein the laser light source is a laser diode fabricated within an interposer layer that interfaces with a surface of the first substrate.

10. The sensor of claim 9, wherein the moving sensor component is a micro-electromechanical system (MEMS) inertial sensor proof mass.

11. The sensor of claim 9, further comprising:
a second glass substrate;
a second integrated waveguide optical-pickoff monolithically fabricated within the second substrate and comprising a second coupling port, and a second optical output port;
a second moving sensor component adjacent to the second coupling port and having a degree-of-freedom of motion in a direction perpendicular to the second coupling port;
wherein the laser light source further launches light into the second glass substrate, wherein a portion of the light couples from the second coupling port to the second moving sensor component as a function of a second gap distance between the second coupling port and the second moving sensor component.

12. The sensor of claim 11, the electronics further coupled to the second photodetector, wherein the electronics further calculates the measurement based on attenuation of optical intensity of the light exiting from the second optical output port, wherein the attenuation of optical intensity of the light exiting from the second optical output port is at least in part a function of the second gap distance.

13. The sensor of claim 9, wherein the laser light source is a light-emitting diode (LED).

14. An integrated optical read out sensor, the sensor comprising:
at least a first glass substrate;
an integrated waveguide optical-pickoff monolithically fabricated within the first substrate and comprising an optical input port, a coupling port, and an optical output port;
a moving sensor component adjacent to the coupling port and having a degree-of-freedom of motion in a direction perpendicular to the coupling port of the integrated waveguide;
a laser light source that launches light into the first glass substrate via the optical input port, wherein a portion of the light couples from the coupling port to the moving sensor component as a function of a gap distance between the coupling port and the moving sensor component;
at least one photodetector coupled to the optical output port; and
electronics coupled to the at least one photodetector that calculates a measurement based on an attenuation of optical intensity of the light exiting from the optical output port, wherein the attenuation is at least in part a function of the gap distance;
an integrated waveguide optical pickoff drift sensor coupled to the laser light source, the integrated waveguide optical pickoff drift sensor comprising:
a second coupling port, and a second optical output port;
a static structure separated from the second coupling port by a second gap having a fixed distance;
a second photodetector coupled to the second optical output port;
wherein a portion of the light couples from the second coupling port across the second gap to the static structure.

15. The sensor of claim 14, further comprising:
a drift error calculator coupled to the second photodetector, wherein the drift error calculator calculates an error based on an attenuation of optical intensity of the light exiting from the second optical output port.

16. The sensor of claim 15, wherein the electronics calibrates the measurement based on the drift error.

\* \* \* \* \*